(12) United States Patent
Hao et al.

(10) Patent No.: US 12,028,976 B2
(45) Date of Patent: Jul. 2, 2024

(54) BOARD-TO-BOARD CONNECTION STRUCTURE AND METHOD FOR MANUFACTURING THE SAME

(71) Applicants: HongQiSheng Precision Electronics (QinHuangDao) Co.,Ltd., Qinhuangdao (CN); Avary Holding (Shenzhen) Co., Limited., Shenzhen (CN)

(72) Inventors: Jian-Yi Hao, Shenzhen (CN); Yan-Lu Li, Shenzhen (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 261 days.

(21) Appl. No.: 17/764,402

(22) PCT Filed: Apr. 23, 2020

(86) PCT No.: PCT/CN2020/086492
§ 371 (c)(1),
(2) Date: Mar. 28, 2022

(87) PCT Pub. No.: WO2021/212434
PCT Pub. Date: Oct. 28, 2021

(65) Prior Publication Data
US 2022/0338350 A1 Oct. 20, 2022

(51) Int. Cl.
*H05K 1/14* (2006.01)
*H01R 12/58* (2011.01)
*H05K 3/36* (2006.01)
*H05K 3/42* (2006.01)

(52) U.S. Cl.
CPC ............ *H05K 1/14* (2013.01); *H01R 12/58* (2013.01); *H05K 3/36* (2013.01); *H05K 3/42* (2013.01); *H05K 2201/0335* (2013.01)

(58) Field of Classification Search
CPC ........ H01R 12/58; H01R 12/523; H05K 3/36; H05K 3/42; H05K 2201/10189; H05K 2201/09754
See application file for complete search history.

(56) References Cited

U.S. PATENT DOCUMENTS

| | | | |
|---|---|---|---|
| 2013/0322043 A1* | 12/2013 | Tanaka | H05K 1/144 29/830 |
| 2021/0212209 A1* | 7/2021 | Kim | H05K 1/0215 |
| 2021/0257758 A1* | 8/2021 | Di Stefano | H01L 24/73 |

* cited by examiner

*Primary Examiner* — Paresh Paghadal
(74) *Attorney, Agent, or Firm* — ScienBiziP, P.C.

(57) ABSTRACT

The present disclosure provides a method for manufacturing a board-to-board connection structure. The method includes defining a first through hole in a first circuit board, disposing a first connector within the first through hole by a first conductive paste, and connecting the first connector to a second circuit board on which a second connector is installed, thereby realizing a connection of the two circuit boards, and reducing a height of the two circuit boards after the connection. That is, the height of the board-to-board connection structure is reduced. Additionally, since the first connector is received within the first through hole, the first connector is not easy to be damaged and oxidized. The present disclosure further provides a board-to-board connection structure manufactured by the above method.

10 Claims, 7 Drawing Sheets

BOARD-TO-BOARD CONNECTION STRUCTURE AND METHOD FOR MANUFACTURING THE SAME

FIELD

The subject matter herein generally relates to circuit boards, and more particularly, to a board-to-board connection structure and a method for manufacturing the board-to-board connection structure.

BACKGROUND

With the progress of science and technology, electronic products, such as mobile phones and laptops, are developed to be lighter in weight and thinner. During the manufacturing process of the electronic products, two circuit boards need to be connected together by a connector, which can be carried out by installing a male connector seat and a female connector on board surfaces of the two circuit boards, and connecting the two circuit boards together through the connection of the male connector seat and the female connector.

However, such connection increases the height of the connector between the two circuit boards, so that a total height of the final electronic product is large, which cannot meet actual needs. In addition, the connector, when being exposed outside, is easy to be damaged and oxidized.

SUMMARY

To overcome the above shortcomings, a method for manufacturing a board-to-board connection structure of a reduced height is needed.

In addition, the board-to-board connection structure manufactured by the above method is also needed.

The present disclosure also provides a method for manufacturing a board-to-board connection structure, including:
  providing a first circuit board, the first circuit board including a first base layer, and a first outer wiring layer and a second outer wiring layer formed on two surfaces of the first base layer;
  defining a first through hole in the first circuit board, an area of the first outer wiring layer adjacent to the first through hole forming a first soldering pad;
  forming a first conductive paste on the first soldering pad;
  providing a first connector, disposing the first connector in the first through hole, and electrically connecting the first connector to the first soldering pad through the first conductive paste;
  providing a second circuit board, the second circuit board including a second base layer and two third outer wiring layers formed on two surfaces of the second base layer, one of the two third outer wiring layers including a second soldering pad;
  forming a second conductive paste on the second soldering pad;
  providing a second connector, and electrically connecting the second connector to the second soldering pad through the second conductive paste;
  stacking the first circuit board and the second circuit board together to cause the first connector to face the second connector; and
  electrically connecting the first connector to the second connector to obtain the board-to-board connection structure.

The present disclosure also provides a board-to-board connection structure, including:
  a first circuit board, the first circuit board including a first base layer, and a first outer wiring layer and a second outer wiring layer formed on two surfaces of the first base layer; the first circuit board defining a first through hole, the first outer wiring layer including a first soldering pad adjacent to the first through hole, a first conductive paste being formed on the first soldering pad;
  a first connector, the first connector disposed in the first through hole and electrically connected to the first soldering pad through the first conductive paste;
  a second circuit board, the second circuit board and the first circuit board being stacked together, the second circuit board including a second base layer and a third outer wiring layer formed on the second base layer, the third outer wiring layer including a second soldering pad, a second conductive paste formed on the second soldering pad; and
  a second connector, the second connector electrically connected to the second soldering pad through the second conductive paste, and facing and electrically connected to the first connector.

By defining the first through hole in the first circuit board, disposing the first connector in the first through hole through the first conductive paste, and connecting the first connector to the second circuit board having the second connector, the connection of the two circuit boards is realized. Furthermore, a height after the connection of the two circuit boards is reduced. That is, the height of the board-to-board connection structure is reduced. In addition, since the first connector is received in the first through hole, the first connector is not easy to be damaged and oxidized.

SYMBOL DESCRIPTION OF MAIN COMPONENT board-to-board connection structure 100; first copper-cladding substrate 10; first adhesive layer 101; first copper foil 102; first outer wiring layer 103; circuit substrate 20; first base layer 201; inner wiring layer 202; second copper-cladding substrate 30; second adhesive layer 301; second copper foil 302; second outer wiring layer 303; first circuit board 40; first through hole 41; second through hole 42; first solder mask 50; second solder mask 51; first soldering pad 52; third soldering pad 53; first conductive paste 54; third conductive paste 55; first connector 60; third connector 61; second circuit board 70; second base layer 701; third outer wiring layer 702; third solder mask 71; second soldering pad 72; second conductive paste 73; second connector 74; third circuit board 80; third base layer 801; fourth outer wiring layer 802; fourth solder mask 81; fourth soldering pad 82; fourth conductive paste 83; fourth connector 90.

Implementations of the present technology will now be described, by way of embodiments, with reference to the attached figures.

DETAILED DESCRIPTION

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

It should be noted that when an element is considered to be "fixed to" another element, it can be directly fixed on another element or there may be an intermediate element. When an element is considered to be "connected" to another element, it can be directly connected to another element or there may be an intermediate element. When an element is considered to be "set on" another element, it can be set directly on another element or there may be an intermediate element.

Unless otherwise defined, all technical terms used herein have the same meaning as commonly understood by one of ordinary skill in the art. The technical terms used herein are not to be considered as limiting the scope of the embodiments.

In order to further illustrate the technical means and technical effect of the present disclosure, the following detailed description of the present disclosure is made in combination with the attached drawings and embodiments.

An embodiment of the present disclosure provides a method for manufacturing a board-to-board connection structure, the method includes the following steps.

Figure 1:
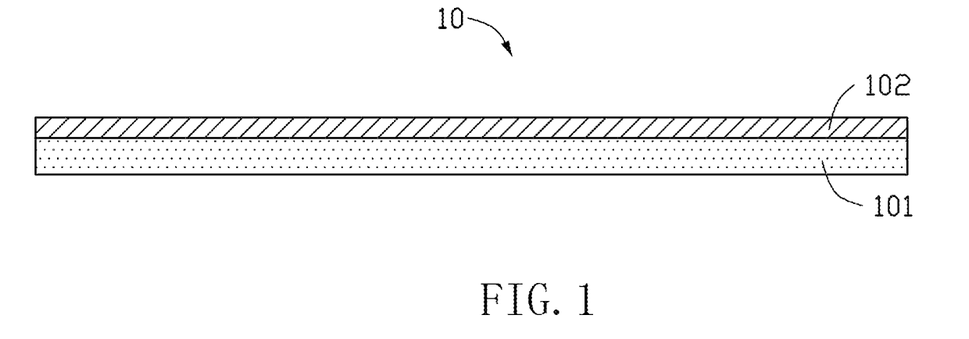
FIG. 1 is a diagrammatic view of an embodiment of a first copper-cladding substrate according to the present disclosure.

In step S11, referring to FIG. 1, a first copper-cladding substrate 10 is provided, which includes a first adhesive layer 101 and a first copper foil 102 formed on the first adhesive layer 101.

The first adhesive layer 101 can be made of a material selected from epoxy resin, polypropylene (PP), BT resin, polyphenylene oxide (PPO), polyimide (PI), polyethylene terephthalate (PET), butadiene styrene copolymer (BS), and polyethylene phthalate (PEN). In an embodiment, the first adhesive layer 101 is made of polyimide.

Figure 2:
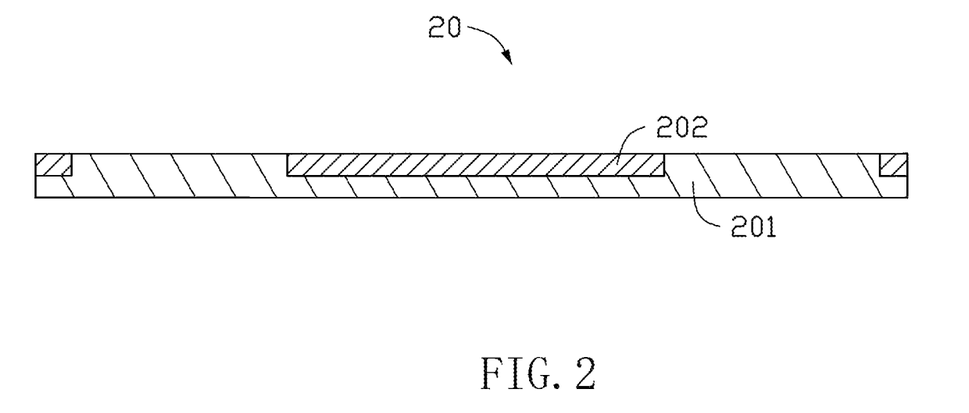
FIG. 2 is a diagrammatic view of an embodiment of a circuit substrate according to the present disclosure.

In step S12, referring to FIG. 2, a circuit substrate 20 is provided, which includes a first base layer 201 and an inner wiring layer 202 formed on the first base layer 201.

The first base layer 201 can be made of a material selected from epoxy resin, polypropylene (PP), BT resin, polyphenylene oxide (PPO), polyimide (PI), polyethylene terephthalate (PET), butadiene styrene copolymer (BS), and polyethylene phthalate (PEN). In an embodiment, the first base layer 201 is made of butadiene styrene copolymer.

Figure 3:
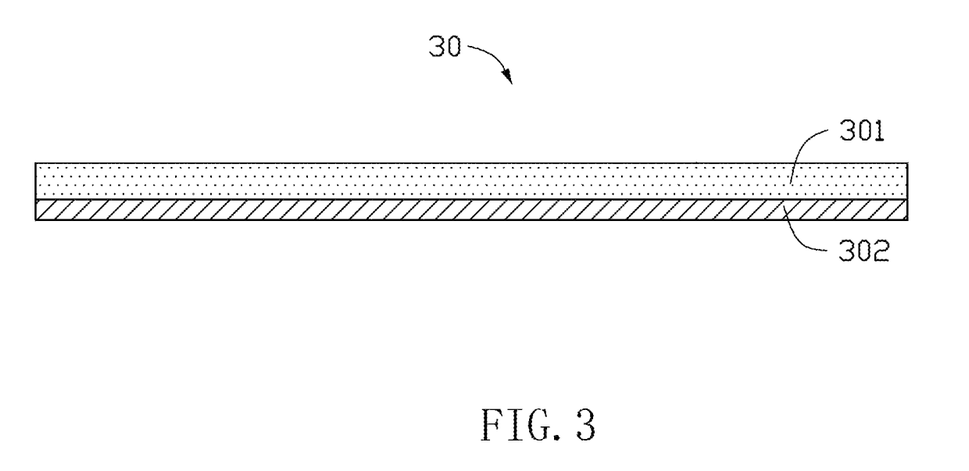
FIG. 3 is a diagrammatic view of an embodiment of a second copper-cladding substrate according to the present disclosure.

In step S13, referring to FIG. 3, a second copper-cladding substrate 30 is provided, which includes a second adhesive layer 301 and a second copper foil 302 formed on the second adhesive layer 301.

The second adhesive layer 301 may be made of a material the same as that of the first adhesive layer 101, which will not be repeated.

Figure 4:
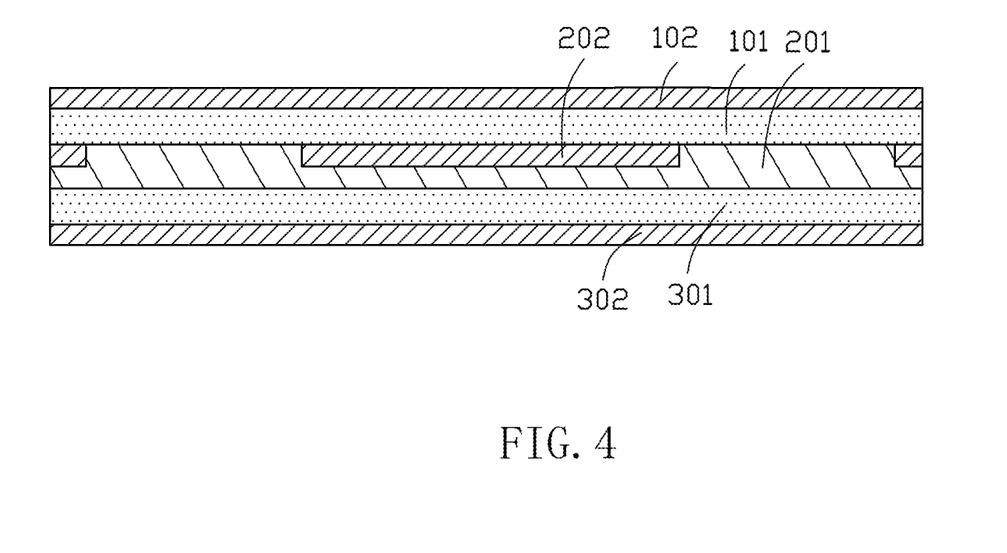
FIG. 4 is a diagrammatic view showing the first copper-cladding substrate of FIG. 1, the circuit substrate of FIG. 2, and the second copper-cladding substrate of FIG. 3 being stacked and pressed together.

In step S14, referring to FIG. 4, the first copper-cladding substrate 10, the circuit substrate 20, and the second copper-cladding substrate 30 are stacked in that order and pressed together.

Figure 5:
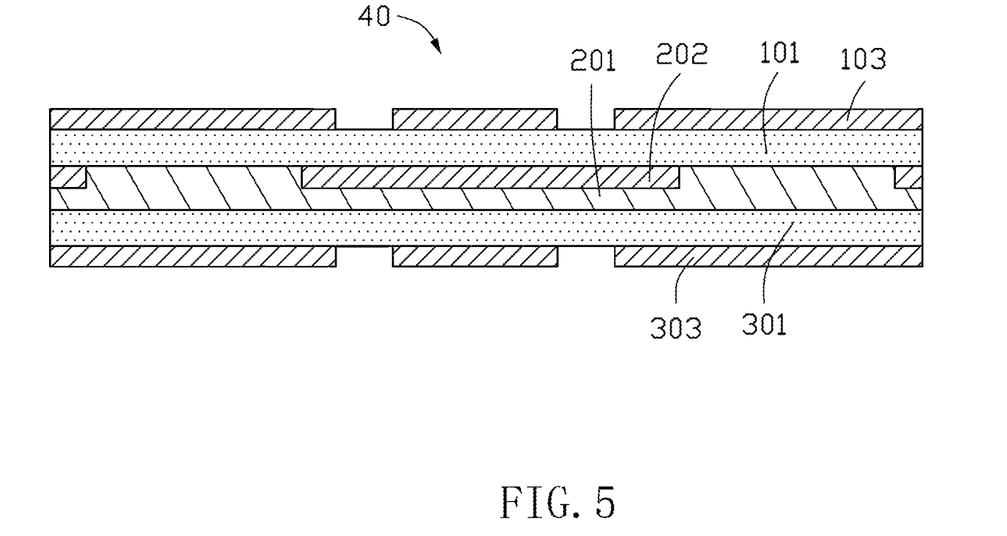
FIG. 5 is a diagrammatic view showing a first copper foil and a second copper foil of FIG. 4 being etched.

In step S15, referring to FIG. 5, the first copper foil 102 and the second copper foil 302 are etched to form a first outer wiring layer 103 and a second outer wiring layer 303 respectively, thereby obtaining a first circuit board 40.

As shown in FIG. 5, only one inner wiring layer 202, only one first outer wiring layer 103, and only one second outer wiring layer 303 are included. However, in other embodiments, the number of the inner wiring layer(s) 202 may also be multiple. For example, two or more inner wiring layers (not shown) may be successively formed on the circuit substrate 20 by a build-up process. Then, the first copper-cladding substrate 10 and the second copper-cladding substrate 30 can cover and be etched to obtain the first outer wiring layer 103 and the second outer wiring layer 303.

Specifically, the outermost first copper foil 102 forms the first outer wiring layer 103. The outermost second copper foil 302 forms the second outer wiring layer 303.

The first outer wiring layer 103, the second outer wiring layer 303, and the inner wiring layer 202 can be formed by an exposure and development process.

Figure 6:
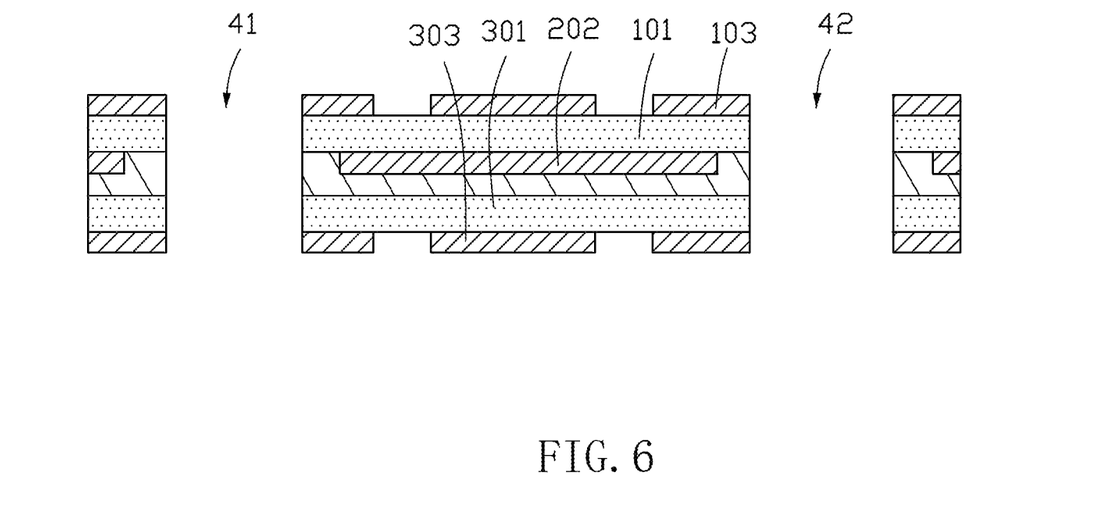
FIG. 6 is a diagrammatic view showing a first through hole and a second through hole being defined in a first circuit board of FIG. 5.

In step S16, referring to FIG. 6, at least one first through hole 41 and at least one second through hole 42 are defined in the first circuit board 40.

The first through hole 41 and the second through hole 42 can be formed by laser drilling.

Each of the first through hole 41 and the second through hole 42 successively penetrates the first outer wiring layer 103, the first adhesive layer 101, the inner wiring layer 202, the first base layer 201, the second adhesive layer 301, and the second outer wiring layer 303.

Figure 7:
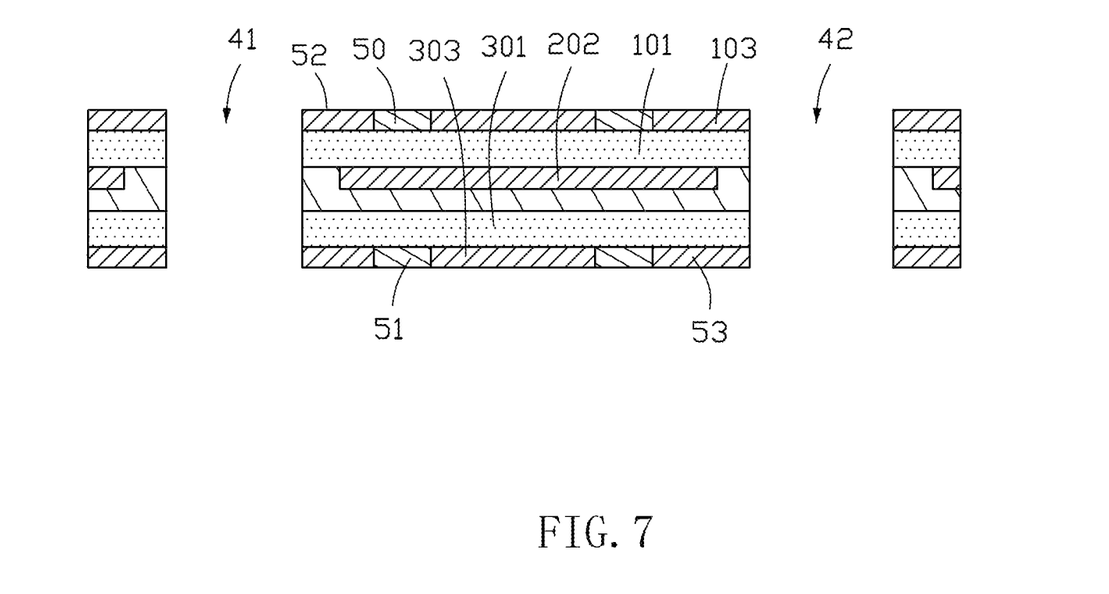
FIG. 7 is a diagrammatic view showing a first solder mask and a second solder mask being formed on a first outer wiring layer and a second outer wiring layer of FIG. 6, respectively.

In step S17, referring to FIG. 7, a first solder mask 50 and a second solder mask 51 are formed on the first outer wiring layer 103 and the second outer wiring layer 303, respectively.

The first solder mask 50 also fills in gaps of the first outer wiring layer 103, and the second solder mask 51 also fills in gaps of the second outer wiring layer 303. The first solder mask 50 is used to protect the first outer wiring layer 103, and the second solder mask 51 is used to protect the second outer wiring layer 303. The first solder mask 50 and the second solder mask 51 can be made of a solder mask ink, such as a green oil.

An area of the first outer wiring layer 103 adjacent to the first through hole 41 is exposed from the first solder mask 50 to form a first soldering pad 52. An area of the second outer wiring layer 303 adjacent to the second through hole 42 is exposed from the second solder mask 51 to form a third soldering pad 53.

Figure 8:
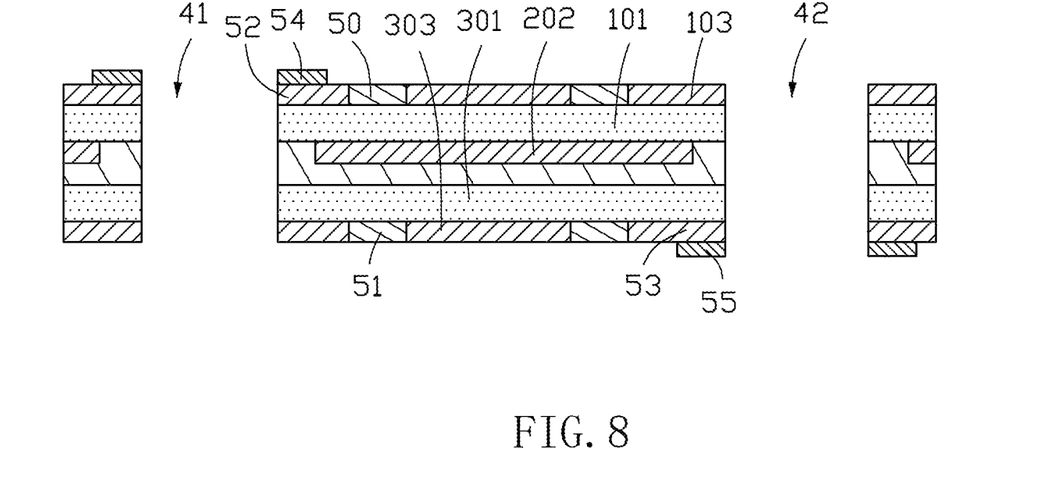
FIG. 8 is a diagrammatic view showing a first conductive paste and a third conductive paste being formed on a first soldering pad and a third soldering pad of FIG. 7, respectively.

In step S18, referring to FIG. 8, a first conductive paste 54 is formed on the first soldering pad 52, and a third conductive paste 55 is formed on the third soldering pad 53.

Figure 9:
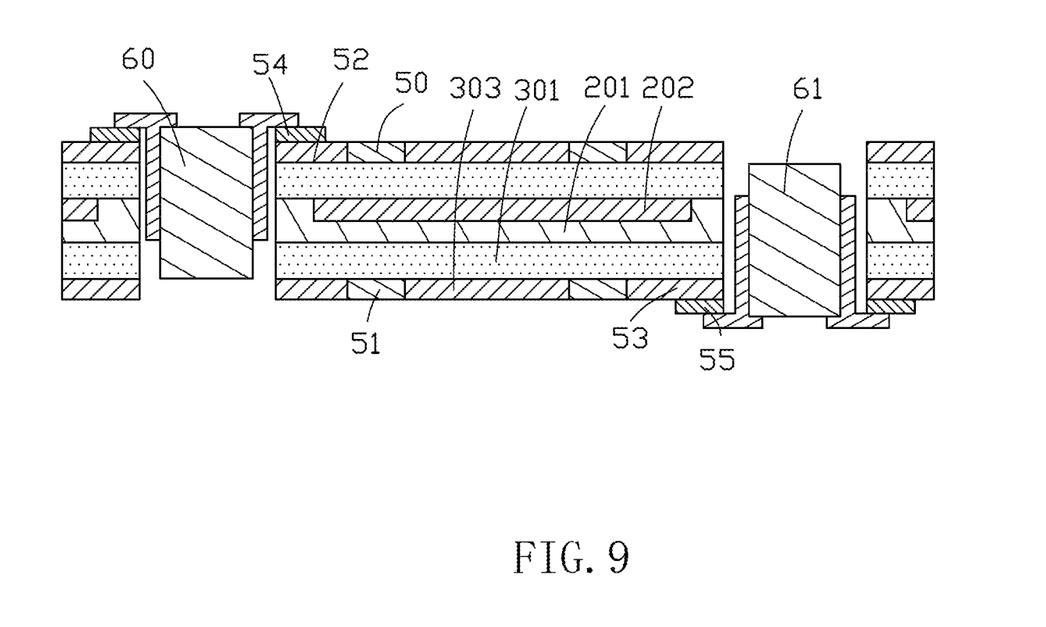
FIG. 9 is a diagrammatic view showing a first connector and a third connector being formed in the first through hole and the second through hole of FIG. 8, respectively.

In step S19, referring to FIG. 9, a first connector 60 and a third connector 61 are provided. The first connector 60 is disposed in the first through hole 41 and electrically connected to the first soldering pad 52 through the first conductive paste 54. The third connector 61 is disposed in the second through hole 42 and electrically connected to the third soldering pad 53 through the third conductive paste 55.

The first conductive paste 54 is used to bond and fix the first connector 60 in the first through hole 41, and electrically connect the first connector 60 to the first soldering pad 52. The third conductive paste 55 is used to bond and fix the third connector 61 in the second through hole 42, and electrically connect the third connector 61 to the third soldering pad 53. Each of the first connector 60 and the third connector 61 may be a male connector or a female connector. In an embodiment, each of the first connector 60 and the third connector 61 is a male connector.

Figure 10:
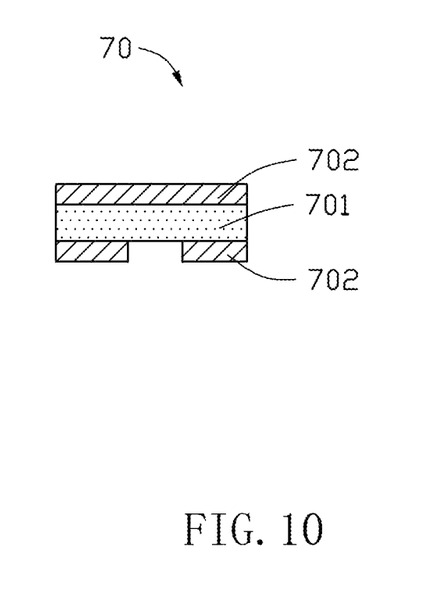
FIG. 10 is a diagrammatic view of an embodiment of a second circuit board according to the present disclosure.

In step S20, referring to FIG. 10, a second circuit board 70 is provided, which includes a second base layer 701 and two third outer wiring layers 702 formed on two surfaces of the second base layer 701.

The second base layer 701 can be made of a material selected from epoxy resin, polypropylene (PP), BT resin, polyphenylene oxide (PPO), polyimide (PI), polyethylene terephthalate (PET), butadiene styrene copolymer (BS), and polyethylene phthalate (PEN). In an embodiment, the second base layer 701 is made of polyimide.

It can be understood that other circuit layers may also be included between the two third outer wiring layers 702. That is, the second circuit board 70 may be a multilayer circuit board. In addition, the second circuit board 70 may also include only one third outer wiring layer 702. That is, the second circuit board 70 is a single-layer circuit board.

Figure 11:
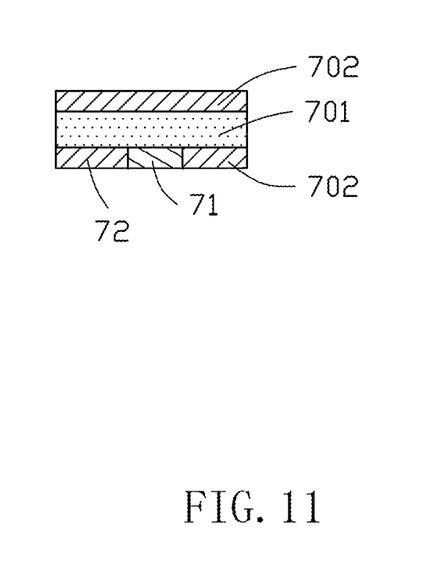
FIG. 11 is a diagrammatic view showing a third solder mask being formed on a third outer wiring layer of FIG. 10.

In step S21, referring to FIG. 11, a third solder mask 71 is formed on one of the two third outer wiring layers 702.

The third solder mask 71 also fills in gaps of the third outer wiring layer 702. The third solder mask 71 is used to protect the third outer wiring layer 702. The third solder mask 71 can be made of a solder mask ink, such as a green oil.

An area of the third outer wiring layer 702 is exposed from the region of the third solder mask 71 to form a second soldering pad 72.

Figure 12:
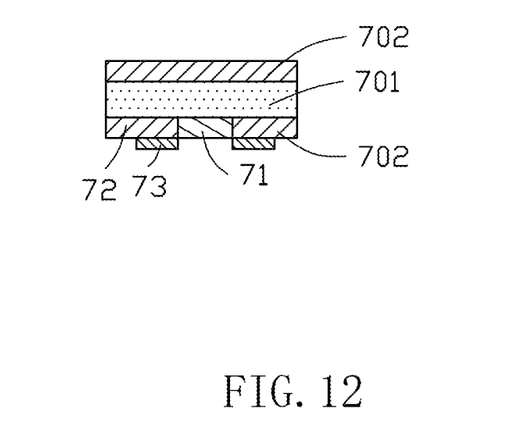
FIG. 12 is a diagrammatic view showing a second conductive paste being formed on a second soldering pad of FIG. 11.

In step S22, referring to FIG. 12, a second conductive paste 73 is formed on the second soldering pad 72.

Figure 13:
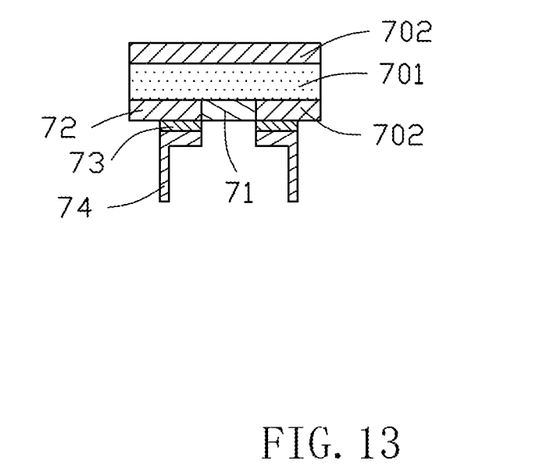
FIG. 13 is a diagrammatic view showing a second connector being formed on the second soldering pad of FIG. 12.

In step S23, referring to FIG. 13, a second connector 74 is provided, and the second connector 74 is electrically connected to the second soldering pad 72 through the second conductive paste 73.

The second conductive paste 73 is used to bond and fix the second connector 74 on the third outer wiring layer 702, and electrically connect the second connector 74 to the second soldering pad 72. The second connector 74 is a male connector or a female connector. In an embodiment, the second connector 74 is a female connector.

Figure 14:
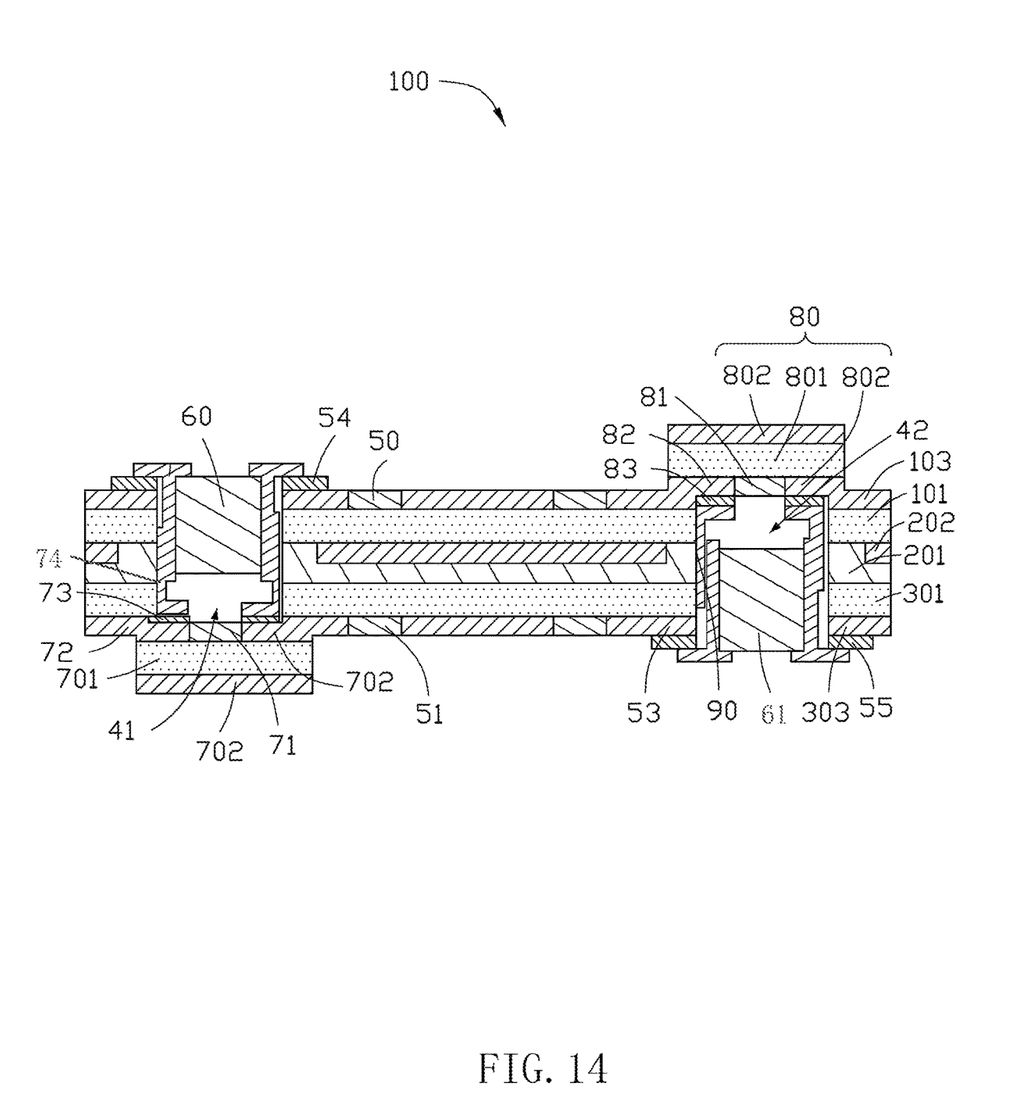
FIG. 14 is a diagrammatic view of a board-to-board connection structure obtained by electrically connecting the first connector and the third connector of FIG. 9 to the second connector and a fourth connector of FIG. 13, respectively.

In step S24, referring to FIG. 14, a third circuit board 80 is provided, which includes a third base layer 801 and two fourth outer wiring layers 802 formed on two surfaces of the third base layer 801.

The third base layer 801 can be made of a material selected from epoxy resin, polypropylene (PP), BT resin, polyphenylene oxide (PPO), polyimide (PI), polyethylene terephthalate (PET), butadiene styrene copolymer (BS), and polyethylene phthalate (PEN). In an embodiment, the third base layer 801 is made of polyimide.

It can be understood that other circuit layers may also be included between the two fourth outer wiring layers 802. That is, the third circuit board 80 may be a multilayer circuit board. In addition, the third circuit board 80 may include only one fourth outer wiring layer 802. That is, the third circuit board 80 is a single-layer circuit board.

In step S25, a fourth solder mask 81 is formed on one of the two fourth outer wiring layers 802.

The fourth solder mask 81 also fills in gaps of the fourth outer wiring layer 802. The fourth solder mask 81 is used to protect the fourth outer wiring layer 802. The fourth solder mask 81 can be made of a solder mask ink, such as a green oil.

An area of the fourth outer wiring layer 802 is exposed from the fourth solder mask 81 to form a fourth soldering pad 82.

In step S26, a fourth conductive paste 83 is formed on the fourth soldering pad 82.

In step S27, a fourth connector 90 is provided, which is electrically connected to the fourth soldering pad 82 through the fourth conductive paste 83.

The fourth conductive paste 83 is used to bond and fix the fourth connector 90 on the fourth outer wiring layer 802, and electrically connect the fourth connector 90 to the fourth soldering pad 82. The fourth connector 90 is a male connector or a female connector. In an embodiment, the fourth connector 90 is a female connector.

In step S28, the second circuit board 70, the first circuit board 40, and the third circuit board 80 are stacked in that order, causing the first connector 60 to face the second connector 74, and the third connector 61 to face the fourth connector 90.

In step S29, the first connector 60 is electrically connected to the second connector 74, and the third connector 61 is electrically connected to the fourth connector 90, thereby obtaining the board-to-board connection structure 100.

The male connector and the female connector have existing structures, that is, the male connector can be inserted into the female connector to realize electrical connection. The specific structure will not be repeated here.

Referring to FIG. 14, the present disclosure also provides a board-to-board connection structure 100, including a first circuit board 40, a first solder mask 50, a second solder mask 51, a first connector 60, a third connector 61, a second circuit board 70, a third solder mask 71, a second connector 74, a third circuit board 80, a fourth solder mask 81, and a fourth connector 90.

The first circuit board 40 includes a first base layer 201, and a first outer wiring layer 103 and a second outer wiring layer 303 formed on both surfaces of the first base layer 201.

The first base layer 201 can be made of a material selected from epoxy resin, polypropylene (PP), BT resin, polyphenylene oxide (PPO), polyimide (PI), polyethylene terephthalate (PET), butadiene styrene copolymer (BS), and polyethylene phthalate (PEN). In an embodiment, the first base 201 is made of butadiene styrene copolymer.

The first circuit board 40 also includes at least one inner wiring layer 202 between the first outer wiring layer 103 and the second outer wiring layer 303. A first adhesive layer 101 is arranged between the inner wiring layer 202 and the first outer wiring layer 103, and a second adhesive layer 301 is arranged between the inner wiring layer 202 and the second outer wiring layer 303. In the present embodiment, only one inner wiring layer 202 is included.

The first adhesive layer 101 can be made of a material selected from epoxy resin, polypropylene (PP), BT resin, polyphenylene oxide (PPO), polyimide (PI), polyethylene terephthalate (PET), butadiene styrene copolymer (BS), and polyethylene phthalate (PEN). In an embodiment, the first adhesive layer 101 is made of polyimide.

The second adhesive layer 301 may be made of a material the same as that of the first adhesive layer 101, which will not be repeated.

The first circuit board 40 defines at least one first through hole 41 and at least one second through hole 42.

Each of the first through hole 41 and the second through hole 42 successively penetrates the first outer wiring layer 103, the first adhesive layer 101, the inner wiring layer 202, the first base layer 201, the second adhesive layer 301, and the second outer wiring layer 303.

The first solder mask 50 is formed on the first outer wiring layer 103, and the second solder mask 51 is formed on the second outer wiring layer 303.

The first solder mask 50 also fills in the gaps of the first outer wiring layer 103, and the second solder mask 51 also fills in the gaps of the second outer wiring layer 303. The first solder mask 50 is used to protect the first outer wiring layer 103, and the second solder mask 51 is used to protect the second outer wiring layer 303. The first solder mask 50 and the second solder mask 51 can be made of a solder mask ink, such as a green oil.

An area of the first outer wiring layer 103 adjacent to the first through hole 41 is exposed from the first solder mask 50 to form a first soldering pad 52, and an area of the second outer wiring layer 303 adjacent to the second through hole 42 is exposed from the second solder mask 51 to form a third soldering pad 53. A first conductive paste 54 is formed on the first soldering pad 52, and a third conductive paste 55 is formed on the third soldering pad 53.

The first connector 60 is disposed in the first through hole 41 and electrically connected to the first soldering pad 52 through the first conductive paste 54. The third connector 61 is disposed in the second through hole 42, and electrically connected to the third soldering pad 53 through the third conductive paste 55.

The first conductive paste 54 is used to bond and fix the first connector 60 to the first through hole 41, and electrically connect the first connector 60 and the first soldering pad 52. The third conductive paste 55 is used to bond and fix the third connector 61 in the second through hole 42, and electrically connect the third connector 61 and the third soldering pad 53. Each of the first connector 60 and the third connector 61 may be a male connector or a female connector. In an embodiment, the first connector 60 and the third connector 61 are male connectors.

The second circuit board 70 and the first circuit board 40 are stacked together. The second circuit board 70 includes a second base layer 701 and two third outer wiring layers 702 formed on two surfaces of the second base layer 701.

The second base layer 701 can be made of a material selected from epoxy resin, polypropylene (PP), BT resin, polyphenylene oxide (PPO), polyimide (PI), polyethylene terephthalate (PET), styrene copolymer (BS), and polyethylene phthalate (PEN). In an embodiment, the second base layer 701 is made of polyimide.

It can be understood that other circuit layers may also be included between the two third outer wiring layers 702. That is, the second circuit board 70 may be a multilayer circuit board. In addition, the second circuit board 70 may include only one third outer wiring layer 702. That is, the second circuit board 70 is a single-layer circuit board.

The third solder mask 71 is formed on one of the two third outer wiring layers 702. The third solder mask 71 also fills in the gaps of the third outer wiring layer 702. The third solder mask 71 is used to protect the third outer wiring layer 702. The third solder mask 71 can be made of a solder mask ink, such as a green oil.

An area of the third outer wiring layer 702 is exposed from the third solder mask 71 to form a second soldering pad 72. A second conductive paste 73 is formed on the second soldering pad 72.

The second connector 74 is electrically connected to the second soldering pad 72 through the second conductive paste 73, and faces and electrically connects to the first connector 60.

The second conductive paste 73 is used to bond and fix the second connector 74 on the third outer wiring layer 702, and electrically connect the second connector 74 to the second soldering pad 72. The second connector 74 is a male connector or a female connector. In an embodiment, the second connector 74 is a female connector.

The third circuit board 80 and the first circuit board 40 are stacked together. The third circuit board 80 includes a third base layer 801 and two fourth outer wiring layers 802 formed on two surfaces of the third base layer 801.

The third base layer 801 can be made of a material selected from epoxy resin, polypropylene (PP), BT resin, polyphenylene oxide (PPO), polyimide (PI), polyethylene terephthalate (PET), butadiene styrene copolymer (BS), and polyethylene phthalate (PEN). In an embodiment, the third base layer 801 is made of polyimide.

It can be understood that other circuit layers may also be included between the two fourth outer wiring layers 802. That is, the third circuit board 80 may be a multilayer circuit board. In addition, the third circuit board 80 may include only one fourth outer wiring layer 802. That is, the third circuit board 80 is a single-layer circuit board.

The fourth solder mask 81 is formed on one of the two fourth outer wiring layers 802. The fourth solder mask 81 also fills in the gaps of the fourth outer wiring layer 802. The fourth solder mask 81 is used to protect the fourth outer wiring layer 802. The fourth solder mask 81 can be made of a solder mask ink, such as a green oil.

An area of the fourth outer wiring layer 802 is exposed from the fourth solder mask 81 to form a fourth soldering pad 82. A fourth conductive paste 83 is formed on the fourth soldering pad 82.

The fourth connector 90 is electrically connected to the fourth soldering pad 82 through the fourth conductive paste 83, and faces and electrically connects the third connector 61.

The fourth conductive paste 83 is used to bond and fix the fourth connector 90 on the fourth outer wiring layer 802, and electrically connect the fourth connector 90 to the fourth soldering pad 82. The fourth connector 90 is a male connector or a female connector. In an embodiment, the fourth connector 90 is a female connector.

The male connector and the female connector have existing structures, that is, the male connector can be inserted into the female connector to realize electrical connection. The specific structure will not be repeated here.

By defining the first through hole 41 in the first circuit board 40, disposing the first connector 60 in the first through hole 41 through the first conductive paste 54, and connecting the first connector 60 to the second circuit board 70 having the second connector 74, the connection of the two circuit boards is realized. Furthermore, a height after the connection of the two circuit boards is reduced. That is, the height of the board-to-board connection structure 100 is reduced. In addition, since the first connector 60 is received in the first through hole 41, the first connector 60 is not easy to be damaged and oxidized.

The embodiments shown and described above are only examples. Many details are often found in the art. Therefore, many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for manufacturing a board-to-board connection structure, comprising:
   providing a first circuit board, the first circuit board comprising a first base layer, and a first outer wiring layer and a second outer wiring layer formed on two surfaces of the first base layer;
   defining a first through hole in the first circuit board, an area of the first outer wiring layer adjacent to the first through hole forming a first soldering pad;
   forming a first conductive paste on the first soldering pad;
   providing a first connector, disposing the first connector in the first through hole, and electrically connecting the first connector to the first soldering pad through the first conductive paste;
   providing a second circuit board, the second circuit board comprising a second base layer and two third outer wiring layers formed on two surfaces of the second base layer, one of the two third outer wiring layers comprising a second soldering pad;
   forming a second conductive paste on the second soldering pad;
   providing a second connector, and electrically connecting the second connector to the second soldering pad through the second conductive paste;
   stacking the first circuit board and the second circuit board together to cause the first connector to face the second connector; and
   electrically connecting the first connector to the second connector to obtain the board-to-board connection structure.

2. The method for manufacturing the board-to-board connection structure according to claim 1, wherein the first circuit board also defines a second through hole, an area of the second outer wiring layer adjacent to the second through hole forms a third soldering pad; the method further comprises:
   forming a third conductive paste on the third soldering pad;
   providing a third connector, disposing the third connector in the second through hole, and electrically connecting the third connector to the third soldering pad through the third conductive paste;
   providing a third circuit board, the third circuit board comprising a third base layer and a fourth outer wiring layer formed on the third base layer, the fourth outer wiring layer comprising a fourth soldering pad;
   forming a fourth conductive paste on the fourth soldering pad;
   providing a fourth connector, and electrically connecting the fourth connector to the fourth soldering pad through the fourth conductive paste;
   stacking the third circuit board and the first circuit board together to cause the fourth connector to face the third connector; and
   electrically connecting the fourth connector to the third connector.

3. The method for manufacturing the board-to-board connection structure according to claim 2, wherein the first circuit board further comprises at least one inner wiring layer between the first outer wiring layer and the second outer wiring layer, a first adhesive layer is arranged between the at least one inner wiring layer and the first outer wiring layer, and a second adhesive layer is arranged between the at least one inner wiring layer and the second outer wiring layer.

4. The method for manufacturing the board-to-board connection structure according to claim 3, wherein after defining the first through hole and the second through hole and before forming the first conductive paste and the second conductive paste, the method further comprises:
   forming a first solder mask on the first outer wiring layer; and
   forming a second solder mask on the second outer wiring layer;
   wherein the area of the first outer wiring layer adjacent to the first through hole is exposed from the first solder mask to form the first soldering pad, and the area of the second outer wiring layer adjacent to the second through hole is exposed from the second solder mask to form the third soldering pad.

5. The method for manufacturing the board-to-board connection structure according to claim 3, wherein the first circuit board is manufactured by:
   providing at least one first copper-cladding substrate, each of the at least one first copper-cladding substrate comprising the first adhesive layer and a first copper foil formed on the first adhesive layer;
   providing a circuit substrate, the circuit substrate comprising the first base layer and the at least one inner wiring layer formed on the first base layer;
   providing at least one second copper-cladding substrate, each of the at least one second copper-cladding substrate comprising the second adhesive layer and a second copper foil formed on the second adhesive layer;
   stacking and pressing the at least one first copper-cladding substrate, the circuit substrate, and the at least one second copper-cladding substrate together; and
   etching the first copper foil and the second copper foil to form the first outer wiring layer and the second outer wiring layer, respectively, thereby obtaining the first circuit board.

6. A board-to-board connection structure, comprising:
a first circuit board, the first circuit board comprising a first base layer, and a first outer wiring layer and a second outer wiring layer formed on two surfaces of the first base layer; the first circuit board defining a first through hole, the first outer wiring layer comprising a first soldering pad adjacent to the first through hole, a first conductive paste being formed on the first soldering pad;
a first connector, the first connector disposed in the first through hole and electrically connected to the first soldering pad through the first conductive paste;
a second circuit board, the second circuit board and the first circuit board being stacked together, the second circuit board comprising a second base layer and a third outer wiring layer formed on the second base layer, the third outer wiring layer comprising a second soldering pad, a second conductive paste formed on the second soldering pad; and
a second connector, the second connector electrically connected to the second soldering pad through the second conductive paste, and facing and electrically connected to the first connector.

7. The board-to-board connection structure according to claim 6, wherein the first circuit board also defines a second through hole, the second outer wiring layer comprises a third soldering pad adjacent to the second through hole, a third conductive paste is formed on the third soldering pad;
the board-to-board connection structure further comprises:
a third connector, the third connector is disposed in the second through hole and electrically connected to the third soldering pad through the third conductive paste;
a third circuit board, the third circuit board and the first circuit board are stacked together, the third circuit board comprises a third base layer and a fourth outer wiring layer formed on the third base layer, the fourth outer wiring layer comprises a fourth soldering pad, a fourth conductive paste is formed on the fourth soldering pad; and
a fourth connector, the fourth connector is electrically connected to the fourth soldering pad through the fourth conductive paste, and the fourth connector faces and is electrically connected to the third connector.

8. The board-to-board connection structure according to claim 7, wherein the first circuit board further comprises at least one inner wiring layer between the first outer wiring layer and the second outer wiring layer, a first adhesive layer is arranged between the at least one inner wiring layer and the first outer wiring layer, a second adhesive layer is arranged between the at least one inner wiring layer and the second outer wiring layer.

9. The board-to-board connection structure according to claim 8, further comprising:
a first solder mask formed on the first outer wiring layer; and
a second solder mask formed on the second outer wiring layer,
wherein an area of the first outer wiring layer adjacent to the first through hole is exposed from the first solder mask to form the first soldering pad, and an area of the second outer wiring layer adjacent to the second through hole is exposed from the second solder mask to form the third soldering pad.

10. The board-to-board connection structure according to claim 7, wherein the first connector and the third connector are male connectors, and the second connector and the fourth connector are female connectors.

* * * * *